(12) United States Patent
Seki et al.

(10) Patent No.: US 11,342,249 B2
(45) Date of Patent: May 24, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Masanari Seki, Kanagawa (JP); Daisuke Koike, Tokyo (JP); Masahiko Hori, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/786,416

(22) Filed: Feb. 10, 2020

(65) Prior Publication Data

US 2021/0074611 A1 Mar. 11, 2021

(30) Foreign Application Priority Data

Sep. 6, 2019 (JP) .............................. JP2019-163440

(51) Int. Cl.
*H01L 23/495* (2006.01)
*H01L 23/00* (2006.01)

(52) U.S. Cl.
CPC .. *H01L 23/49513* (2013.01); *H01L 23/49562* (2013.01); *H01L 24/32* (2013.01); *H01L 24/83* (2013.01); *H01L 2224/32245* (2013.01); *H01L 2224/83192* (2013.01)

(58) Field of Classification Search
CPC ............... H01L 23/49513; H01L 24/83; H01L 23/49562; H01L 24/32; H01L 2224/32245; H01L 2224/83192
See application file for complete search history.

(56) References Cited

U.S. PATENT DOCUMENTS

| 6,703,696 B2 * | 3/2004 | Ikenaga | H01L 24/49 257/678 |
| 2002/0084518 A1 * | 7/2002 | Hasebe | H01L 21/4853 257/676 |
| 2015/0069638 A1 | 3/2015 | Hiratsuka et al. | |
| 2019/0148251 A1 * | 5/2019 | Okabe | H01L 23/29 257/788 |

FOREIGN PATENT DOCUMENTS

JP 2015-56238 A 3/2015

* cited by examiner

*Primary Examiner* — Robert G Bachner
(74) *Attorney, Agent, or Firm* — Allen & Overy LLP

(57) ABSTRACT

The semiconductor device of the present embodiment includes a lead frame having a projection portion, the projection portion having an upper face and a side face, a semiconductor chip provided above the projection portion, and a bonding material provided between the projection portion and the semiconductor chip, the bonding material being in contact with the upper face and the side face, the bonding material bonding the lead frame and the semiconductor chip.

10 Claims, 6 Drawing Sheets

SEMICONDUCTOR DEVICE

CROSS-REFERENCE TO RELATED APPLICATION

This application is based upon and claims the benefit of priority from Japanese Patent Application No. 2019-163440, filed on Sep. 6, 2019, the entire contents of which are incorporated herein by reference.

FIELD

Embodiments described herein relate generally to a semiconductor device.

BACKGROUND

Power semiconductor chips designed for power control have been developed which are a metal-oxide-semiconductor field-effect-transistor (MOSFET), an insulated gate bipolar transistor (IGBT) and the like used in a wide range of fields such as power generation and power transmission, rotating machines such as pumps and blowers, power supplies for communication systems and factories, railways with AC motors, electric vehicles, and home electric appliances.

Further, development of a semiconductor device as a power module including such a power semiconductor chip has been performed. Such semiconductor devices are required to have specifications such as high current density, low loss, and high heat dissipation.

DETAILED DESCRIPTION

Figure 1A:
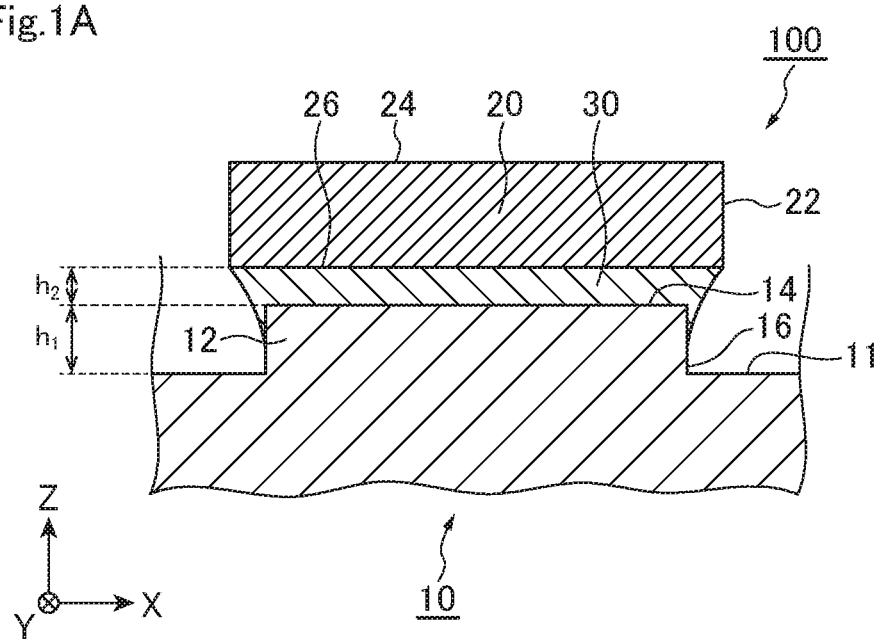
FIGS. 1A and 1B are schematic cross-sectional views of a semiconductor device of a first embodiment.

Hereinafter, embodiments of the present disclosure will be described with reference to the drawings. In the following description, the same or similar members may be denoted by the same reference numerals. Further, description of members once described may be omitted as appropriate.

In the present specification, the upper direction of the drawing is described as "upper" and the lower direction of the drawing as "lower" in order to indicate the positional relationship of parts and the like. In the present specification, the terms "upper" and "lower" are not necessarily terms indicating the relationship with the direction of gravity.

First Embodiment

The semiconductor device of the present embodiment includes a lead frame having a projection portion, the projection portion having an upper face and a side face, a semiconductor chip provided above the projection portion, and a bonding material provided between the projection portion and the semiconductor chip, the bonding material being in contact with the upper face and the side face, the bonding material bonding the lead frame and the semiconductor chip.

Figure 1B:
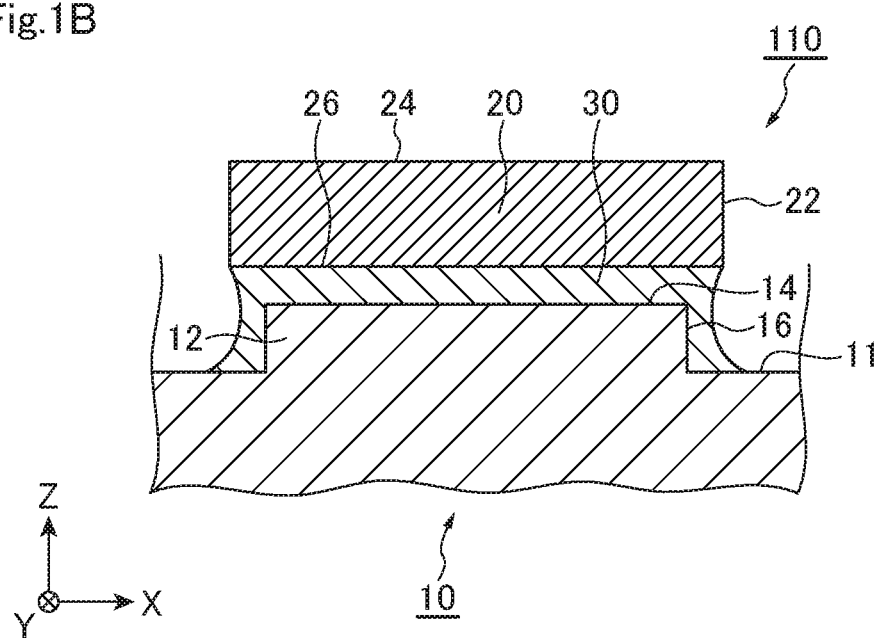

FIGS. 1A and 1B are schematic cross-sectional views of a semiconductor device 100 of an embodiment;

FIG. 1A is a schematic cross-sectional view of a semiconductor device 100 of according to an aspect of the present embodiment.

The semiconductor device 100 includes a lead frame 10, a semiconductor chip 20, and a bonding material 30.

The lead frame 10 is formed of a metal such as copper (Cu) or an alloy, for example. The surface of the lead frame 10 may be provided with a thin film (not shown) including, for example, gold (Au), platinum (Pt), palladium (Pd), silver (Ag), copper (Cu), tin (Sri), nickel (Ni), or the like.

The lead frame 10 has a projection portion 12. In FIG. 1A, the upper face 14 and the side face 16 of the projection portion 12 and the upper face 11 of the lead frame around the projection portion 12 are also shown.

The height $h_1$ of the projection portion 12 is preferably 20 μm or more and 35 μm, or less.

The semiconductor chip 20 is provided above the projection portion 12. The semiconductor chip 20 has a side face 22, an upper face 24, and a chip face (lower face) 26.

The semiconductor chip 20 is, for example, a vertical Si-IGBT including silicon (Si). The semiconductor chip 20 may be an Si-MOSFET, a fast recovery diode (Si-FRD), an SiC-IGBT including silicon carbide (SiC), an SiC-MOSFET or a schottky barrier diode (SiC-SBD), or a GaN-MOSFET including a nitride semiconductor in which the group V element is nitrogen in a III-V group semiconductor. The semiconductor chip 20 may not be a so-called power semiconductor chip.

The chip thickness of the semiconductor chip 20 is, for example, about 250 μm. Note that the chip thickness of the semiconductor chip 20 is not limited to this.

The bonding material 30 is provided between the projection portion 12 and the semiconductor chip 20. The bonding material 30 is in contact with the upper face 14 and the side face 16 of the projection portion 12 to bond the lead frame 10 and the semiconductor chip 20.

Although the bonding material 30 is not particularly limited, for example, a die attach material including an insulator such as an epoxy die attach material, a silicone die attach material, a polyimide die attach material, an acrylic die attach material, or the like, or a die attach material including a material having electrical conductivity is preferably used. For example, when the bonding material 30 is a die attach material including a material having electrical conductivity, and the semiconductor chip 20 is a vertical Si-IGBT including silicon (Si), the current flowing through the semiconductor chip 20 flows into the lead frame 10 including the projection portion 12 of the bonding material 30 via the bonding material 30.

FIG. 1B is a schematic cross-sectional view of a semiconductor device according to another aspect of the present embodiment. The bonding material 30 spreads over and contacts the upper face 11 of the lead frame around the projection portion 12.

Figure 2A:
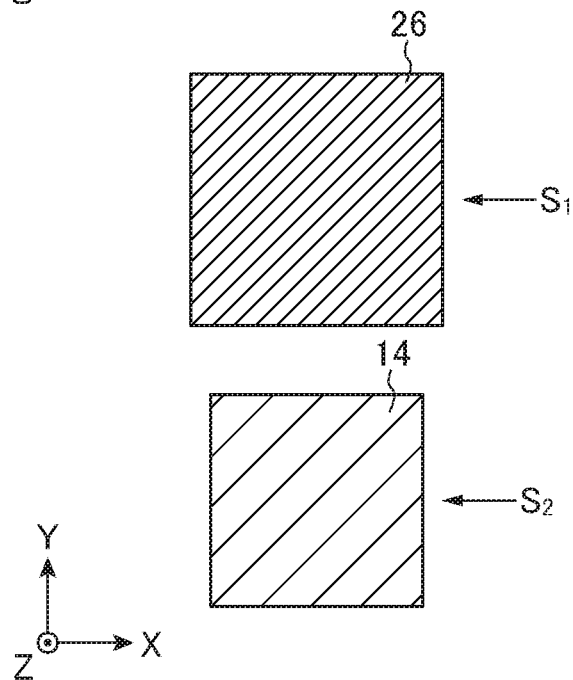
FIGS. 2A and 2B are schematic views showing the shape of the chip face and the shape of the upper face of the projection portion of the first embodiment.
Figure 2B:
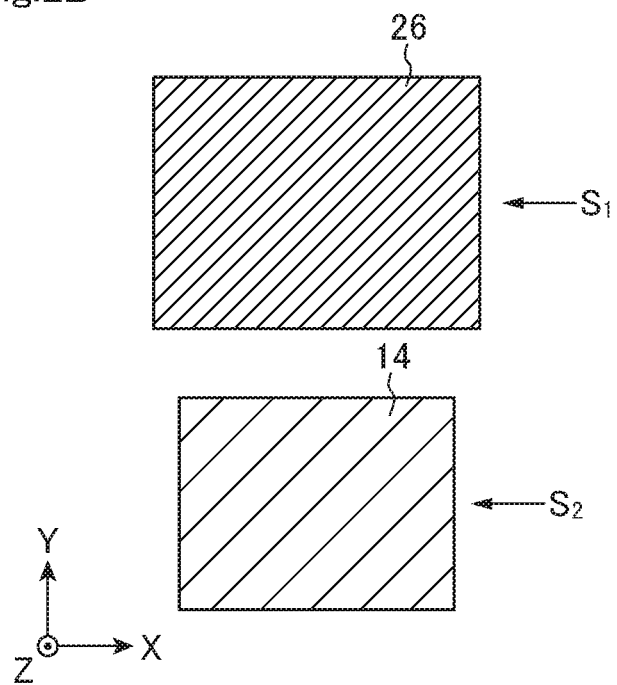

FIGS. 2A and 2B are schematic views showing the shape of a chip face 26 and the shape of the upper face 14 of the projection portion 12 of the embodiment.

In FIG. 2A, the shape of the chip face 26 and the shape of the upper face 14 of the projection portion 12 are both square. In FIG. 2B, the shape of the chip face 26 and the shape of the upper face 14 of the projection portion 12 are both rectangular. Note that the shape of the chip face 26 and the shape of the upper face 14 of the projection portion 12 are not limited to this, and may be, for example, a triangle or a circle.

When the area of the chip face 26 of the semiconductor chip 20 is $S_1$, and the area of the upper face 14 of the projection portion 12 is $S_2$, it is preferable that $0.7S_1 \leq S_2 \leq 0.9S_1$ be satisfied.

The shape of the chip face 26 and the shape of the upper face 14 of the projection portion 12 are preferably similar to each other. In FIG. 2A, the shape of the chip face 26 and the shape of the upper face 14 of the projection portion 12 are both square and similar to each other. In FIG. 2B, the shape of the chip face 26 and the shape of the upper face 14 of the projection portion 12 are both rectangular and similar to each other.

FIGS. 3A to 3D are schematic cross-sectional views showing the semiconductor device 100 in the process of manufacture in the manufacturing method of the semiconductor device 100 of the embodiment. FIG. 4 is a flowchart of the manufacturing method of the semiconductor device 100 of the present embodiment.

First, the lead frame 10 having the projection portion 12 is prepared. Here, the projection portion 12 is formed, for example, by etching or coining of the lead frame 10 (FIG. 3A, FIG. 4 (S10)).

Figure 3A:
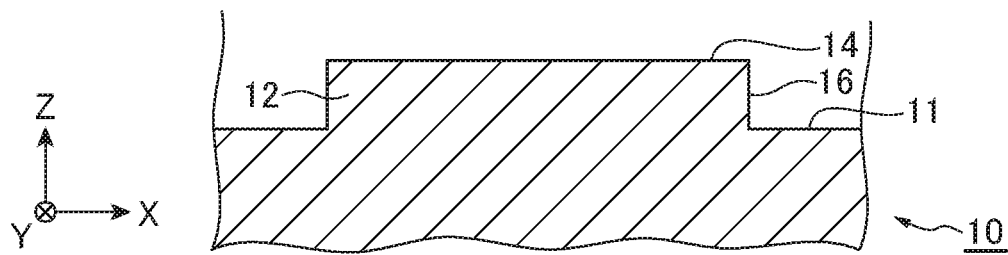
FIGS. 3A to 3D are schematic cross-sectional views showing the semiconductor device in the process of manufacture in the manufacturing method of the semiconductor device of the first embodiment.
Figure 3B:
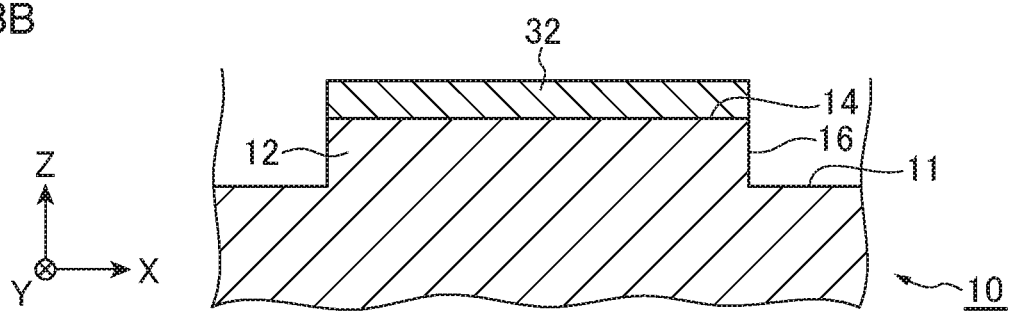
Figure 3C:
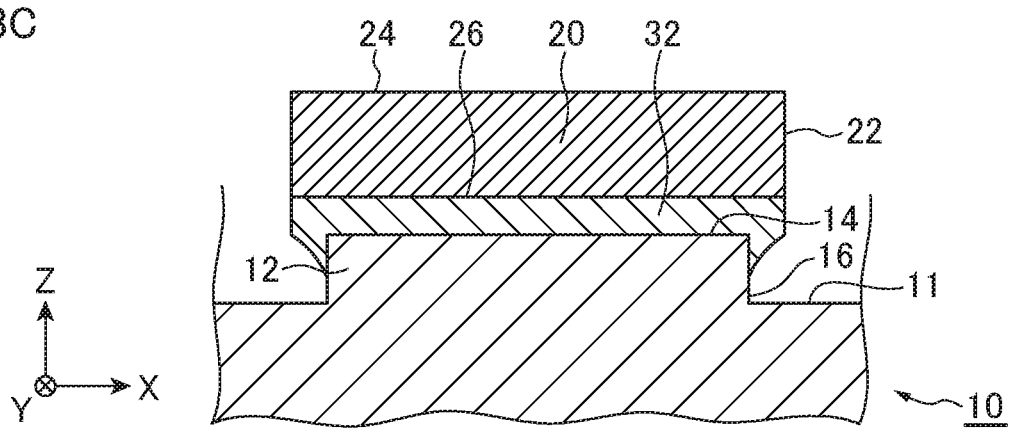
Figure 3D:
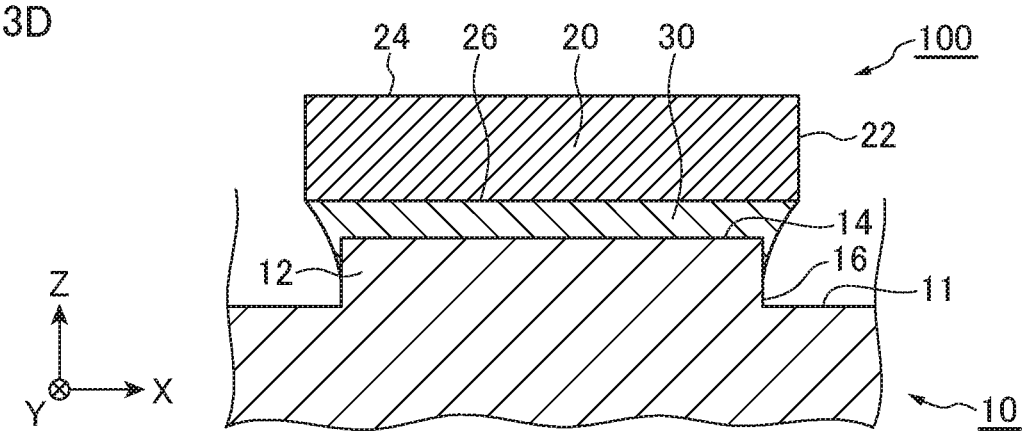
Figure 4:
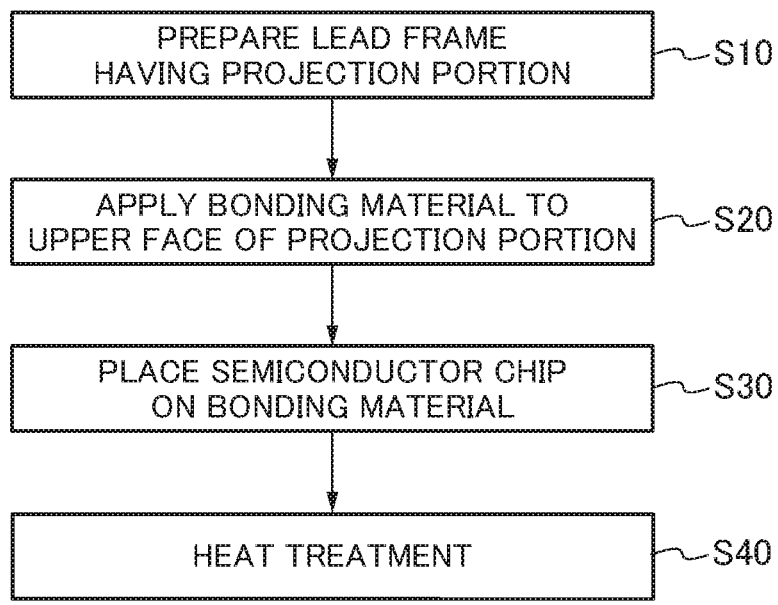
FIG. 4 is a flowchart of a manufacturing method of the semiconductor device of the first embodiment.

Next, an unsolidified bonding material 32 is applied on the upper face 14 of the projection portion 12 (FIG. 3B, FIG. 4 (S20)).

Next, the semiconductor chip 20 is placed on the unsolidified bonding material 32. At this time, the unsolidified bonding material 32 protrudes from the side face 16 of the projection portion and contacts the side face 16 of the projection portion. Although not shown, the unsolidified bonding material 32 may protrude from the upper face 11 of the lead frame 10 around the projection portion 12 and may be in contact with the upper face 11 of the lead frame 10 around the projection portion 12 (FIG. 3C, FIG. 4 (S30)). Further, the unsolidified bonding material 32 may spread over and contact the upper face 11 of the lead frame around the projection portion 12.

Next, in a state where the semiconductor chip 20 is placed, the lead frame 10, the unsolidified bonding material 32, and the semiconductor chip 20 are heat-treated. Thereby, the unsolidified bonding material 30 is solidified to become the bonding material 30, and bonds the lead frame 10 and the semiconductor chip 20 to obtain the semiconductor device 100 of this embodiment (FIG. 3D, FIG. 4 (S40)).

Next, the function and effect of the semiconductor device 100 of the present embodiment will be described.

Figure 5A:
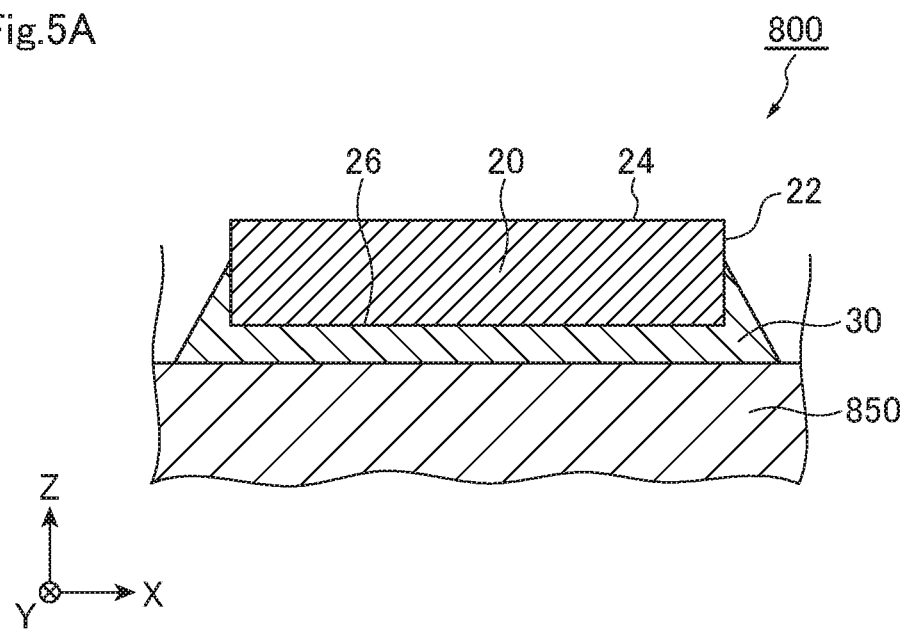
FIGS. 5A and 5B are schematic cross-sectional views of a semiconductor device that is a comparative example of the first embodiment.
Figure 5B:
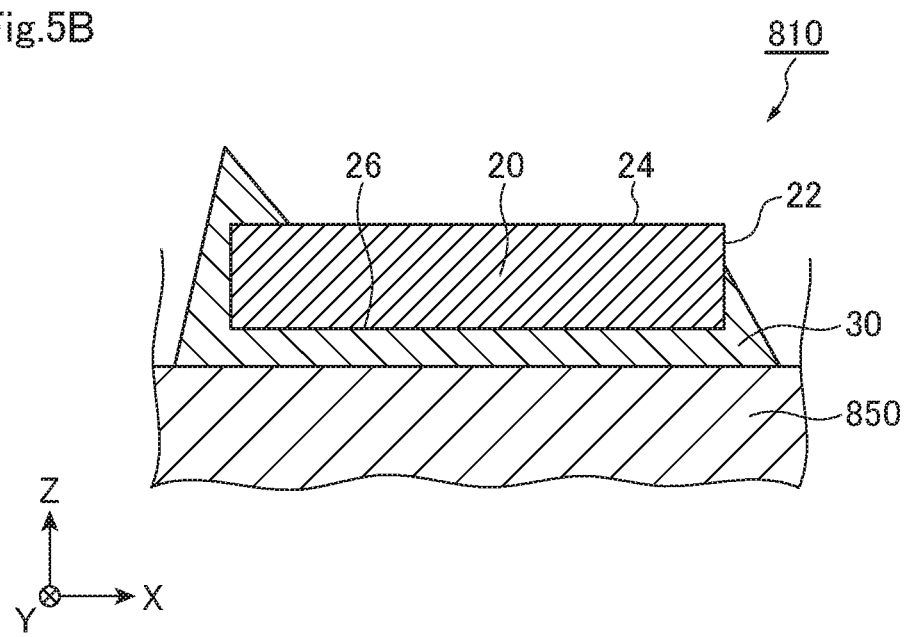

FIGS. 5A and 5B are schematic cross-sectional views of a semiconductor device that is a comparative example of the present embodiment. FIG. 5A is a schematic cross-sectional view of a semiconductor device 800 that is a comparative embodiment of the present embodiment, and FIG. 5B is a schematic cross-sectional view of a semiconductor device 810 that is a comparative embodiment of the present embodiment.

When the semiconductor chip 20 is placed on the lead frame, the bonding material 30 is used. Here, when the semiconductor chip 20 is placed on the unsolidified bonding material 32, part of the unsolidified bonding material 32 spreads from the lower side of the semiconductor chip 20.

There is a problem that the bonding material 30 contacts the side face 22 of the semiconductor chip 20 (FIG. 5A), or the bonding material 30 contacts the upper face 24 of the semiconductor chip (FIG. 5B). In particular, when the bonding material 30 has conductivity, there is a problem that the electrode provided on the upper face 24 of the semiconductor chip 20 and the electrode provided on the chip face (lower face) 26 of the semiconductor chip are short-circuited.

In order to solve this problem, it is conceivable to increase the film thickness of the semiconductor chip 20. However, particularly in the case of a vertical Si-IGBT or the like, there is a problem that the on-resistance increases as the film thickness of the semiconductor chip 20 increases.

When the film thickness of the semiconductor chip 20 is thin, by using a sheet-like die attach film (DAF) as the bonding material 30, the problem that the bonding material 30 contacts the side face 22 and the upper face 24 of the semiconductor chip 20 can be avoided. However, since the die attach film is expensive, there is a problem that it is difficult to apply the die attach film to the semiconductor chip 20 having a low unit price.

In the semiconductor device of this embodiment, the lead frame 10 has the projection portion 12. The semiconductor chip 20 is provided above the projection portion 12, and is bonded using a bonding material 30 provided between the semiconductor chip 20 and the projection portion 12.

By providing the projection portion 12, when the semiconductor chap 20 is placed on the unsolidified bonding material 32, the unsolidified bonding material 32 spreads over the side face 16 of the projection portion 12, and spreads over and contacts the side face 16 of the projection portion 12 or the upper face 11 of the lead frame around the projection portion 12. As a result, it is possible to suppress the contact of the bonding material 30 with the side face 22 and the upper face 24 of the semiconductor chip 20, thus a semiconductor device with improved reliability can be provided.

When the area of the chip face 26 of the semiconductor chip 20 is $S_1$, and the area of the upper face 14 of the projection portion 12 is $S_2$, it is preferable that $0.7S_1 \leq S_2 \leq 0.9S_1$ satisfied. When $S_2 < 0.7S_1$ is satisfied, since the area $S_2$ of the upper face 14 of the projection portion 12 is too small, the semiconductor chip 20 may not be fixed onto the projection portion 12. In addition, since the projection portion 12 is too small, there is a possibility that the resistance between the semiconductor chip 20 and the lead frame 10 may increase when the current flowing through the semiconductor chip 20 flows into the projection portion 12. On the other hand, when $0.9S_1 < S_2$ is satisfied, since the area $S_2$ of the upper face 14 of the projection portion 12 is too large, there is a possibility that the entire unsolidified bonding material 32 is not placed within the side face 16 of the projection portion 12 or the upper face 11 of the lead frame, and contacts the side face 22 and the upper face 24 of the semiconductor chip 20.

The shape of the chip face 26 of the semiconductor chip 20 and the shape of the upper face 14 of the projection portion 12 are preferably similar to each other. This is because the bonding material 30 is distributed as uniformly as possible on the side face 16 of the projection portion 12 and the upper face 11 of the lead frame around the projection portion 12 to further improve the reliability.

The height $h_1$ of the projection portion 12 is preferably 20 μm or more and 35 μm or less. When the height $h_1$ of the projection portion 12 is less than 20 μm, since the height $h_1$ of the projection portion 12 is too low, there is a possibility that the entire unsolidified bonding material 32 is not placed within the side face 16 of the projection portion 12 or the upper face 11 of the lead frame, and contacts the side face or the upper face of the semiconductor chip 20. On the other hand, when the height h₁ of the projection portion 12 exceeds 35 µm, since the projection portion 12 is too high, the resistance between the semiconductor chip 20 and the lead frame 10 may increase.

According to the semiconductor device of the present embodiment, it is possible to provide the semiconductor device with improved reliability.

Second Embodiment

The semiconductor device of the present embodiment is different from the semiconductor device of the first embodiment in that the angle formed by the side face 16 of the projection portion 12 and the upper face 11 of the lead frame 10 around the projection portion 12 is greater than 90 degrees. Here, the description of the second embodiment overlapping that of the first embodiment will be omitted.

Figure 6:
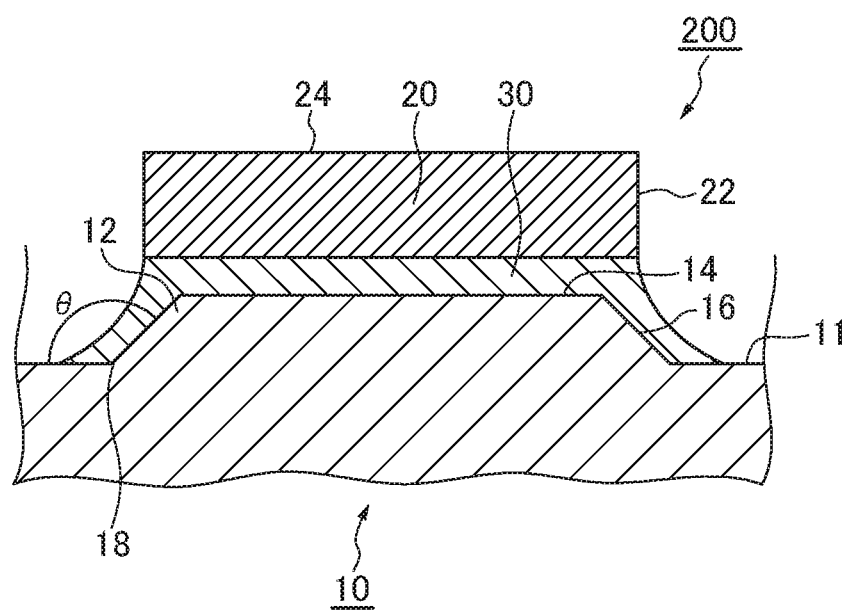
FIG. 6 is a schematic cross-sectional view of a semiconductor device of a second embodiment.

FIG. 6 is a schematic cross-sectional view of a semiconductor device 200 according to the present embodiment.

In the semiconductor device 200, the angle θ formed by the side face 16 of the projection portion 12 and the upper face 11 of the lead frame 10 around the projection portion 12 is larger than 90 degrees.

The unsolidified bonding material 32 may contain bubbles. The bubbles are likely to stay in the portion 18 where the side face 16 of the projection portion 12 and the upper face 11 of the lead frame around the projection portion intersect and in its vicinity. When the unsolidified bonding material 32 is solidified to contain the bubbles and becomes the bonding material 30, the bubbles repeatedly contract with the thermal cycle of the semiconductor device, thus deterioration of the bonding material 30 such as cracks may occur. When the angle θ is larger than 90 degrees, the bubbles easily pass through upward the side face 16 of the projection portion 12 and escape. Therefore, this problem can be avoided.

According to the semiconductor device of the present embodiment, it is possible to provide the semiconductor device with improved reliability.

While certain embodiments have been described, these embodiments have bees presented by way of example only, and are not intended to limit the scope of the inventions. Indeed, the semiconductor device described herein may be embodied in a variety of other forms; also, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a lead frame having a projection portion and a first upper face provided around the projection portion, the projection portion having a second upper face and a plurality of side faces, a shape of the second upper face being a rectangle, and the first upper face being directly connected with each of the side faces;
a semiconductor chip having a chip face, the semiconductor chip being provided above the projection portion, a width of the second upper face of the projection portion being shorter than a width of the chip face of the semiconductor chip, an area of the second upper face of the projection portion being smaller than an area of the chip face of the semiconductor chip; and
a bonding material provided between the projection portion and the semiconductor chip, the bonding material being in direct contact with the semiconductor chip, the second upper face of the projection portion and the side faces of the projection portion, and the bonding material bonding the lead frame and the semiconductor chip.

2. The semiconductor device according to claim 1, wherein $0.7S_1 \leq S_2 \leq 0.9S_1$ is satisfied, where $S_1$ is an area of the chip face of the semiconductor chip and $S_2$ is an area of the second upper face of the projection portion.

3. The semiconductor device according to claim 2, wherein a shape of the chip face and a shape of the second upper face are similar to each other.

4. The semiconductor device according to claim 1, wherein the projection portion has a height of 20 µm or more and 35 µm or less.

5. The semiconductor device according to claim 1, wherein an angle formed by the side face of the projection portion and the first upper face of the lead frame around the projection portion is greater than 90 degrees.

6. The semiconductor device according to claim 1, wherein
the bonding material is in contact with the first upper face of the lead frame around the projection portion.

7. The semiconductor device according to claim 1, wherein the bonding material has electrical conductivity.

8. The semiconductor device according to claim 1, wherein a wire is not connected to the semiconductor chip.

9. The semiconductor device according to claim 1, wherein an angle formed by the side face of the projection portion and the first upper face of the lead frame around the projection portion is 90 degrees.

10. The semiconductor device according to claim 1, wherein the bonding material is provided apart from the first upper face of the lead frame around the projection portion.

* * * * *